United States Patent [19]

Knors et al.

[11] Patent Number: 5,654,376

[45] Date of Patent: Aug. 5, 1997

[54] POLYMERIC DYES FOR ANTIREFLECTIVE COATINGS

[75] Inventors: Christopher John Knors, Bound Brook, N.J.; Elwood Herbert Macy, Hughsonville; Wayne Martin Moreau, Wappingers Falls, both of N.Y.

[73] Assignee: International Business Machines Corporation, Armonk, N.Y.

[21] Appl. No.: 466,566

[22] Filed: Jun. 6, 1995

Related U.S. Application Data

[62] Division of Ser. No. 168,885, Dec. 16, 1993.

[51] Int. Cl.$^6$ .......................... G03C 1/492; G03C 1/494; C08F 20/08
[52] U.S. Cl. .......................... 525/327.4; 430/270.1; 430/272.1; 430/323; 522/904; 525/327.5
[58] Field of Search .................... 430/323, 270, 430/272, 270.1; 522/904; 525/327.4, 327.5

[56] References Cited

U.S. PATENT DOCUMENTS

| | | | |
|---|---|---|---|
| 2,751,373 | 6/1956 | Unruh et al. | 260/78.5 |
| 2,811,509 | 10/1957 | Smith et al. | 260/63 |
| 3,763,086 | 10/1973 | Kalopissis et al. | 260/41 |
| 3,854,946 | 12/1974 | Sayigh et al. | 96/35.1 |
| 3,945,831 | 3/1976 | Satomura | 96/86 P |
| 4,370,405 | 1/1983 | O'Toole et al. | 430/312 |
| 4,575,480 | 3/1986 | Kotani et al. | 430/192 |
| 4,609,614 | 9/1986 | Pampalone et al. | 430/323 |
| 4,728,724 | 3/1988 | Jones, Jr. et al. | 430/270.1 |
| 4,828,960 | 5/1989 | Hertog | 430/191 |
| 4,882,260 | 11/1989 | Kohara et al. | 430/191 |
| 4,910,122 | 3/1990 | Arnold et al. | 430/313 |
| 4,943,511 | 7/1990 | Lazarus et al. | 430/192 |
| 4,948,697 | 8/1990 | Durham | 430/165 |
| 4,981,915 | 1/1991 | MacLeay et al. | 525/327.6 |
| 5,043,243 | 8/1991 | Yajima et al. | 430/191 |
| 5,074,643 | 12/1991 | Petisce | 385/128 |
| 5,244,994 | 9/1993 | Linehan | 526/259 |
| 5,294,680 | 3/1994 | Knors et al. | 525/327.4 |
| 5,328,803 | 7/1994 | Fujikura et al. | 430/281 |
| 5,362,812 | 11/1994 | Holmes et al. | 525/274 |
| 5,401,614 | 3/1995 | Dichiara et al. | 430/323 |
| 5,482,817 | 1/1996 | Dichiara et al. | 430/323 |
| 5,516,886 | 5/1996 | Rahman et al. | 528/482 |

FOREIGN PATENT DOCUMENTS

| | | |
|---|---|---|
| 63-122666A2 | 11/1988 | Japan . |
| 200359 | 12/1979 | Switzerland . |
| 2267095 | 11/1993 | United Kingdom . |

OTHER PUBLICATIONS

"Antireflection Layers and Planarization for Microlithography"; Solid State Technology; Horn Nov. 1991.
D. Widmann, et al., *IEEE Trans. Electron Devices*, ED–22, 467 (1975).
M. Bolsen, et al., *Solid State Tech.*, Feb. 1986, 83.
T. Brunner, *SPIE*, 1466, 297 (1991).
T. Tanaka, et al. *J. Electrochem Soc.* 137, 3900, (1990).
T. Pampalone, et al. *J. Electrochem Soc.* 136, 1181, (1989).
W. M. Moreau, *Semiconductor Lithography, Principles, Practices, and Materials*, Prenum, NY, 1988, Chapters 2 and 10.
M. Horn, *Solid State Tech.*, 58, Nov. 1991.

*Primary Examiner*—Terrel Morris
*Attorney, Agent, or Firm*—Steven J. Soucar; Dale M. Crockatt

[57] ABSTRACT

A composition and methods for the use and manufacture thereof are provided for a polymeric dye. The composition comprises one or more aminoaromatic chromophores in conjunction with polymers having an anhydride group or the reaction products thereof. The composition is particularly useful as an underlaying antireflective coating with microlithographic photoresists for the absorbtion of near or deep ultraviolet radiation.

12 Claims, No Drawings

POLYMERIC DYES FOR ANTIREFLECTIVE COATINGS

The application is a division of application Ser. No. 08/168,885, filed Dec. 16, 1993 pending.

BACKGROUND OF THE INVENTION

1. Field of the Invention

The present invention relates to novel compositions comprising dyes which are chemically linked to polymeric imides. Such compositions are useful as antireflective layers or coatings. Such compositions are also especially useful in the fabrication of integrated circuit devices by photolithographic techniques.

2. Description of Related Art

In the fabrication of integrated circuits, the exposure of a photoresist to light is an integral process step. The production of high density circuits having sub micron dimensions requires that such exposure be accomplished within close processing tolerances. For example, it is important to control the linewidth of the imaged and developed photoresist so that any deviation from the nominal design linewidth over non-planar or reflective features is small, typically less than 10%.

The difficulty in controlling linewidth in high resolution photoresist patterns over reflective topography is well documented. See, for example, D. Widmann and H. Binder, *IEEE Trans. Electron Devices*, ED-22, 467 (1975). When photoresist layers overlaying reflective substrates are exposed using monochromatic light sources, a constructive interference pattern between the normally incident exposing light and light reflected from the substrate is created in the resist. The resulting pattern of optical nodes and antinodes which is normal to the plane of the reflective interface, and repeats along the optical axis, is the cause of localized variations in the effective dose of exposing light. This phenomenon is known in the art as the interference or standing wave effect. Other pattern distortions are caused by light reflected angularly from topographical features and are discussed by M. Bolsen, G. Buhr, H. Merrem, and K. Van Werden, *Solid State Tech.*, February 1986, 83. These distortions are known in the art as reflective notching.

The quantification of the interference effect can be measured by using the swing ratio (SR), set forth by T. Brunner, *SPIE*, 1466, 297 (1991), $$SR = 4(R_1 R_2)^{1/2} e^{-\alpha D}$$

where $R_1$ is the reflectivity of the resist/air interface and $R_2$ is the reflectivity of the resist/substrate interface at the exposing wavelength, $\alpha$ is the resist absorbtion coefficient, and D is the resist thickness. A low swing ratio implies that localized variations in the effective dose of exposing light are small, and thus the exposure dose is more uniform throughout the thickness of the film. One method to reduce the swing ratio is use of a photoresist or lithographic process which imparts a high numerical value in $\alpha$ or D, giving a high numerical value to the product of $\alpha D$. Other methods for reducing the swing ratio are the use of coatings which reduce the contribution of R1 or R2, such as through the use of antireflective layers.

The lithographic techniques for overcoming the problems of forming patterns on reflective topography include dyes added to the photoresists as described in U.S. Pat. No. 4,575,480 to Kotani, et al., U.S. Pat. No. 4,828,960 to Hertog, U.S. Pat. No. 4,882,260 to Kohara, et al., and U.S. Pat. No. 5,043,243 to Yajima, et al., top surface imaging (TSI) processes, multilayer resists (MLR) with added dyes as described in U.S. Pat. No. 4,370,405 to O'Toole, et al., top antireflective layers (TARL), bottom antireflective layers (BARL) which may comprise inorganic materials or organic materials, and coatings comprising polyamic acids or polybutene sulfone with added dyes.

When a dye is added to photoresist to form an optically sensitive film having high optical density at the wavelength of the exposing radiation, several problems may be encountered. These include sublimation of the dyes during baking of the films, loss of resist sensitivity, difficulties during deep ultra violet hardening processes which are commonly used with novolak comprising resists, thinning of the resists in alkaline developers, and distortion of the resulting relief image. TSI processes require high optical density at the wavelength of the exposing radiation and similar processing difficulties are often encountered. Furthermore, TSI and MLR processes are costly and complex.

Tanaka, et al., have disclosed the use of a TARL as an optical element overlaying a photoresist layer, however, this approach is not effective in reducing top notching effects from underlaying reflective topography and also requires removal with halogenated solvents prior to the photoresist development step. T. Tanaka, N. Hasegwa, H. Shiraishi, and S. Okazaki, *J. Electrochem. Soc.*, 137, 3900 (1990).

Inorganic BARLs such as silicon require precise control of the film thickness, which for a typical 300 Å thick film is ±10 Å. T. Pampalone, M. Camacho, B. Lee, and E. Douglas, *J. Electrochem. Soc.*, 136, 1181 (1989). Pampalone has described the use of titanium oxynitrides on aluminum surfaces to reduce reflectivity from 85% to 25%, however, TiNxOy processes require special deposition—equipment, complex adhesion promotion techniques prior to resist application, a separate dry etching pattern transfer step, and dry etching for removal. Horn has disclosed the similar use of titanium nitride antireflective coatings, however, such coatings are often incorporated into the completed semiconductor device as a permanent element, thus TiN coatings are not suitable for use with every photolithographic layer. M. Horn, *Solid State Tech.*, November 1991, 58.

U.S. Pat. No. 4,910,122 to Arnold, et al., discloses organic BARLs comprising polyamic acids or polybutene sulfones with added dyes. The films derived from the polyamic acid compositions are cured by baking at a temperature of at least 148° C. for 30 minutes. Pampalone has noted that the baking conditions must be carefully controlled to prevent the occurrence of oversized or undersized relief images in the imaged and developed photoresist. Horn has noted that the BARL tended to peel or leave a residual scum. The polyamic acid based BARL is also developed with alkaline developer of the resist. Concurrently, any Al layers which may be in contact with the BARL are attacked by the alkaline developer, which may cause lifting of the BARL and resist layer.

The films derived from polybutene sulfone with coumarin dyes require coating thicknesses of 2.0 μm and baking at 140° C. for 60 minutes. The 2.0 μm thick film of polybutene sulfone may tend to fill in and planarize deep trenches, resulting in localized regions having a film thicker than 2.0 μm, and requiring plasma over etching to remove the film. The use of a 2.0 μm layer with an added 1.0 μm resist layer may exceed the usual depth of focus of less than 2 μm for advanced, higher numerical aperture exposure tools. In addition long bake times are not compatible with a rapid throughput cluster tool processing strategy, thus, such materials may require additional or separate long coating or baking steps that add process costs. Polybutene sulfone is also thermally unstable at temperatures above about 120° C. and may decompose with out gassing. This may lift the overlying resist during deep ultra violet hardening or Al etching where the wafer temperature may reach 150° C.

U.S. Pat. No. 2,751,373 to Unruh, et al., U.S. Pat. No. 2,811,509 to Smith, et al., U.S. Pat. No. 3,763,086 to Kalopissis, et al., U.S. Pat. No. 3,854,946 to Sayigh, et al., and U.S. Pat. No. 4,609,614 to Pampalone, et al., disclose the grafting of dyes or small molecules onto polymeric structures consisting of poly(maleic anhydrides), poly (itaconic anhydrides), polyacrylates, and polymethacrylates. The resulting polymers are ring opened products comprising a semi-amide in conjunction with a semi-acid or semi-ester. Most of the resulting polymers are rapidly soluble in aqueous alkaline developers due to the presence of acid or amide groups, and all have at least some appreciable degree of solubility. Thus, these compositions would not be suitable as BARL materials for common resists using aqueous alkaline developers. Furthermore, all of the known compositions are soluble in solvents such as those typically used to cast photoresist films. Therefore, intermixing of polymer layers during application of a BARL material based on these compositions would be a substantial disadvantage.

Czech patent 200,359 to Matejka similarly discloses compositions comprising semi-amides derived from maleic anhydride copolymers, which compositions are also soluble in aqueous alkaline solutions.

BRIEF SUMMARY OF THE INVENTION

The present invention provides novel compositions which comprise the reaction product of a polymer having an anhydride group and an amine dye which strongly absorbs ultraviolet light having a wavelength in the range from about 365 nm to about 436 nm, or from about 193 nm to about 300 nm. By means of the reaction, the polymers have at least one aminoaromatic chromophore chemically linked thereto. The aminoaromatic chromophore may be any aromatic compound having a primary or secondary amino moiety and having a high optical absorbance coefficient. Preferred chromophores have an optical absorbance coefficient of at least about 10/μm.

The compositions of the present invention may be dissolved in various solvents to provide a composition which is useful for forming thin films. The present invention contemplates that the film may be formed by spin casting, extrusion coating, dipping, spraying, or other methods commonly known in the art. If desired, a photoresist film may be applied over the antireflective film. Photolithographic processes comprising the step of applying the antireflective film prior to the patternwise or blanket exposure of the photoresist have improved linewidth control resulting from a reduction of the standing wave effect and also from a reduction of the reflective notching effect.

The present invention also provides methods for the in situ preparation of the novel compositions from precursor compositions comprising maleic anhydride copolymers or glutaric anhydride copolymers or derivatives thereof in combination with aromatic amines. The antireflective film is formed by means of applying the precursor composition to a substrate and heating the substrate to cause further reaction, thus forming a one component antireflective film.

It is an intent of the present invention to provide improved materials for antireflective coatings, and a method for the use thereof.

The antireflective films of the present invention have a high optical absorbance at the wavelength for which they are intended to be used. The optical density is not limited by dye solubility or phase separation. Thus, the film may be thinner than other antireflective films known in the art. Additionally, some alternative embodiments of the present invention have the unexpected advantage of a high refractive index at the wavelength for which they are intended to be used. This is advantageous because the required film thickness for an effective BARL is inversely proportional to the refractive index. A BARL which is thin is advantageous in reducing transfer bias, and may also provide improved focus and alignment characteristics during patternwise exposure of the photoresist.

Furthermore, the antireflective films of the present invention provide a low optical absorbance at wavelengths which are longer than the wavelengths for which they are intended to be used. For example, films derived from the disclosed compositions which are intended to be used with exposing light having a wavelength in the range from about 193 nm to about 300 nm are sufficiently transmissive at wavelengths longer than about 320 nm to permit film thickness measurements by interferometric techniques for process definition and control. Also, films intended for use with exposing light having a wavelength of about 365 nm are similarly transmissive at wavelengths longer than about 425 nm, and films intended for use with exposing light having a wavelength in the range from about 365 nm to about 436 nm are similarly transmissive at wavelengths longer than about 460 nm.

Another advantage of the present compositions is that the optical density is not decreased during subsequent processing steps by loss of the chromophore. It is known that heating of mixtures of volatile dyes in polymers to temperatures above the glass transition point of the polymer may cause the dye to sublime from the film. The disclosed compositions provide a thermally stable antireflective film which is not subject to decreases in optical density when treated at temperatures of up to about 250° C. Similarly, the diffusion of the chromophore into the photoresist layer during any subsequent baking of the resist is minimized or obviated. Furthermore, the chemically bound chromophore of the present invention is not extracted by solvent when a photoresist film is applied over the antireflective film. The disclosed compositions are particularly useful in conjunction with photoresist films cast from solvents comprising esters such as ethyl cellosolve acetate, ethyl ethoxy propionate, ethyl lactate, methyl cellosolve acetate, or propylene glycol acetate.

The antireflective film of the present invention has improved dry etching properties. In $CF_4$ etching processes, the high selectivity ratio between the disclosed BARL materials and the imaged and developed photoresist causes the BARL material to etch at a faster rate than the remaining resist layer, useful for direct etch transfer processes. This allows for another additional variation of a lithographic process in which the BARL layer is etched in situ without separate oxygen etch step, saving time and lowering processing costs. Such uninterrupted $CF_4$ etching of the BARL material and an underlying silicon comprising material also reduces etch transfer bias. A similar process may be used to etch through a BARL material overlaying a metal such as aluminum with an uninterrupted chlorine-based metal etch process.

The disclosed compositions are particularly useful in conjunction with alkaline developable photoresist films. The disclosed BARL compositions resist the action of alkaline developers such as aqueous potassium hydroxide or tetramethylammonium hydroxide, the developers most commonly used to develop novolak-diazoquinone photoresists or acid catalyzed polyhydroxystyrene photoresists. W. Moreau, *Semiconductor Lithography, Principles, Practices, and Materials,* Plenum, New York, 1988, Chapters 2 and 10. This is advantageous because the pattern factor dependent transfer bias is minimized and a special adhesion promoter is not required to prevent lifting.

An additional benefit of the BARL over aluminum layers is that it acts as a barrier against alkaline developer attack on the aluminum layer. In the past, this required the use of sodium silicate based developers which are harmful to CMOS devices because of the sodium ion present. Higher contrast developers, based on tetramethylammonium hydroxide (TMAH), can be used for the photoresist which allows for even higher resolution.

The antireflective film may be coated with a variety of photoresist materials with little or no prior baking of the antireflective layer. A BARL material which permits substrate coating in the same equipment as, and immediately prior to, the application of photoresist without a separate baking step, saves time and lowers process costs.

Additional uses and advantages of the present invention will become apparent to the skilled artisan upon reading the following detailed description of the invention and the preferred embodiments.

DETAILED DESCRIPTION OF THE PREFERRED EMBODIMENTS

According to the invention polymer compositions for bottom antireflective layers (BARLs) for deep UV and near UV microlithography are provided. Deep UV is considered to be ultraviolet light having a wavelength in the range from about 193 nm to about 300 nm. Near UV is considered to be ultraviolet light having a wavelength in the range from about 350 nm to about 436 nm.

The polymer compositions of the invention comprise a reaction product of a polymer having at least one repeating anhydride group with an aminoaromatic compound having high near UV and/or high deep UV absorbance. Preferred copolymer compositions have an optical absorbance coefficient of at least about 10/µm at the wavelength of the exposing light. More preferred compositions have a high optical absorbance coefficient over the range of wavelengths of the exposing radiation. The term optical absorbance coefficient has been defined by Brunner, supra, and will be a known expression to the worker skilled in the art.

The aminoaromatic chromophore is selected so as to absorb strongly at the wavelength of the exposing radiation and yet to permit film thickness measurement on an interferometric tool such as a NANOSPEC instrument and also to permit alignment through the BARL material at longer wavelengths. For example, films derived from the disclosed compositions which are intended to be used with exposing light having a wavelength in the range from about 193 nm to about 300 nm are sufficiently transmissive at wavelengths longer than about 320 nm to permit film thickness measurements by such interferometric techniques, as previously described.

The aminoaromatic chromophore may be any aromatic compound having a primary or secondary amino moiety linked thereto, and having an optical absorbance coefficient of at least about 10/µm. The aminoaromatic chromophore may be an N-aryl amino compound, a benzyl amine, or another aminoaromatic compound wherein the amino group is linked to the aromatic compound by means of an intermediate group. Preferred aminoaromatic chromophores have a primary amino group. More preferred aminoaromatic chromophores have a primary amino group linked to the aromatic compound by means of a N-aryl bond. The most preferred aminoaromatic chromophores are selected from the group consisting of 1-aminoanthracene, 2-aminoanthracene, 1-aminonaphthalene, 2-aminonaphthalene, N-(2,4-dinitrophenyl)-1,4-benzenediamine (Disperse Yellow 9, hereafter referred to as DY-9), p-(2,4-dinitrophenylazo)aniline, p-(4-N,N-dimethylaminophenylazo)aniline, 4-amino-2-(9-(6-hydroxy-3-xanthenonyl))-benzoic acid, 2,4-dinitrophenylhydrazine, dinitroaniline, aminobenzothiazoline, and aminofluorenone. The worker skilled in the art will appreciate that many aminoaromatic compounds having high optical absorbance will be useful in the present invention.

Among the more preferred and most preferred embodiments, many of the disclosed embodiments comprise aminearomatic chromophores chemically linked to polymers by means of an imide moiety, thus forming N-aryl imide compounds. It is noted here that in many of the compositions comprising N-aryl aminoaromatic imides, the π electrons of the aromatic group are in conjugation with the carbonyl group of the polymer. This extended conjugation results in a red shift of the optical absorbance of the resultant reaction product as compared to the starting amine.

While the present invention is described in terms of the N-aryl imide chemical linkage, the skilled artisan will appreciate that many chemical reactions including the imidization reaction rarely proceed to completion and that small quantities of acid, amide, and ester functionalities may be exist in the instant compositions. The presence of such groups in small quantities is anticipated by and is within the spirit of the present invention, provided however, that such compositions are essentially insoluble in aqueous alkaline photoresist developers.

The skilled artisan will appreciate that more than one species of aminoaromatic chromophore may be bonded to the polymeric composition. This may be especially useful for providing a composition having specific optical properties at each of several wavelengths of ultra violet light.

Many of the aminoaromatic chromophores are dyes which are commercially available from the Aldrich Chemical Company, the Eastman Kodak Company, the Sigma Chemical Company, and like sources. Polymers useful in the present invention comprise any polymer having an anhydride group. Particular examples include, without limitation, polydimethylglutarimide, poly(maleic anhydride-co-methylmethacrylate), poly(maleic anhydride-co-vinylmethylether), poly(styrene-co-maleic anhydride), and poly(acrylic anhydride), and derivatives, copolymers, and combinations thereof. Preferred polymers include polymers having a 5 membered or 6 membered cyclic anhydride group.

The polymer can have the following repeat units:

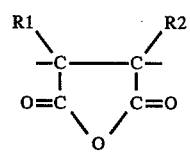

where R1 and R2 may be independently H, alkyl, phenyl or hydrogen, and

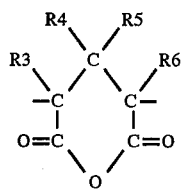

where R3, R4, R5, and R6 may be independently H, alkyl, phenyl or hydrogen.

The polymer can be a copolymer having a first repeat unit having an anhydride group and a second repeat unit having an ethylene group with at least one substituent.

It is known in the art that maleic anhydride monomers which are unsubstituted at the 3 and 4 positions are most amenable to free radical polymerizations, however, in an alternate embodiment of the present invention, a polymer comprising succinic anhydride repeat units substituted in the 3 or 4 or both positions may be selected for the said polymer having an anhydride group.

The present invention contemplates that in another alternate embodiment, a polymer of the general form

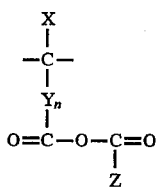

may be selected for the said polymer having an anhydride group, where X, Y, and Z, may be independently H or any chemically stable functionality, and n is an integer including 0. Thus the polymer has an anhydride group bonded through one carbonyl functionality to the polymeric backbone and has another anhydride carbonyl functionality bonded to a pendant group and not to the polymer backbone except through the anhydride oxygen. Where the anhydride group is bonded to the polymer backbone through only one carbonyl functionality, the aminoaromatic chromophore must be selected so as to result in a reaction product which is not soluble in aqueous alkaline developers. Thus, it is expected that where the anhydride group is bonded through only one carbonyl group, the aminoaromatic chromophore must contain a secondary amine, giving rise to an N,N-disubstituted amide reaction product.

The present invention contemplates that polymers having a thioanhydride group, or other isosteric moieties, may be substituted for the said polymer having an anhydride group as a component in similar compositions.

In the disclosed compositions, the aminoaromatic chromophore is chemically linked to the polymer. The linkage results from any set of conditions giving rise to a reaction between the amine group of the chromophore and the carbonyl functionality of the anhydride group. Typically the chemical linkage involves the formation of an imide or amide, however, the skilled artisan will appreciate that such linkage may also involve the formation of other related chemical groups. It is expressly noted that the linkages of the present compositions are covalent bonds, and not ionic bonds, charge transfer complexes, nor other bond types related to association compounds. In the present invention, such covalent chemical bonds are formed by a thermal reaction, however, the skilled artisan will appreciate that other methods of inducing such reactions exist.

The polymeric compositions of the present invention may be dissolved in various solvents to provide a composition which is useful for forming thin films. Particular examples of solvents include, without limitation, Γ-butyrolactone, cyclopentanone, cyclohexanone, dimethyl acetamide, dimethyl formamide, dimethyl sulfoxide, N-methylpyrrolidone, tetrahydrofurfural alcohol, or combinations thereof. The preferred solvents are Γ-butyrolactone, cyclopentanone, and cyclohexanone. In an alternative embodiment, traces of a surfactant such as 3M Fluorad FC-430 may also be added.

The polymeric compositions of the invention are characterized by being immiscible with the photoresist and essentially insoluble in the typical casting solvents used in diazoquinone novolak photoresist compositions. The artisan will appreciate that said typical casting solvents used in diazoquinone novolak photoresist compositions include, without limitation: (a) those solvents recited above wherein the instant compositions are disclosed herein to be particularly useful in conjunction with photoresist films cast from solvents comprising esters such as ethyl cellosolve acetate, ethyl ethoxy propionate, ethyl lactate, methyl cellosolve acetate, or propylene glycol acetate; each is also a well known diazoquinone novolak photoresist solvent. The artisan will further appreciate that said typical casting solvents used in diazoquinone novolak photoresist compositions also include, without limitation: (b) well known casting solvents for diazoquinone novolak photoresists such as the monooxymonocarboxylic acid esters and ethers thereof disclosed in European Patent Application EP 0-211-667-A to Japan Synthetic Rubber Co., Ltd., and in U.S. Pat. No. 4,943,511 to Lazarus, et al.; and (c), well known casting solvents for diazoquinone novolak photoresists such as the propylene glycol alkyl ethers and acetates thereof disclosed in U.S. Pat. No. 4,948,697 to Durham, and; (d) the well known solvents diglyme and the alkyl cellosolves and acetate esters thereof. Furthermore, it is well known from the teachings of Lin, Multi-Layer Resist Systems, in Introduction to Microlithography, Thompson, Editor, and the artisan will appreciate, that an underlying film forming composition will be immiscible with an overlying photoresist composition if the resist casting solvent does not dissolve the underlying film forming composition, and conversely, an underlying film forming composition will be miscible with an overlying photoresist composition if the resist casting solvent dissolves or swells the underlying film forming composition.

The polymeric compositions of the invention are also characterized by being insoluble in the aqueous alkaline developers for such photoresists, thus films formed of the compositions are not readily removed during wet development. Such films are formed by methods well known in the art. The thin films are easily applied and removable by in situ dry etching using the resist image as the etching mask.

It has been found that lithographic patterning on reflective substrates which gives rise to an interference effect, and patterning over features which give rise to angular scattering or reflective notching is substantially improved by the use of the BARL compositions of the present invention. The control of line width variations due to standing wave effects over the uneven topography of underlying reflective features is achieved by the absorbance by the BARL of the imaging wavelengths.

In an alternative embodiment, the composition of the present invention may be applied directly to the lithographic substrate without isolation. Thus, the reaction product in solution may be used directly as a casting formulation.

The following examples more particularly describe the preparation and method of use of the BARL compositions:

EXAMPLE 1

To a solution of 3.0 grams of maleic anhydride-vinylmethylether copolymer having a weight average molecular weight of about 50,000 in 75 grams of dry pyridine was added 5.4 grams of N-(2,4-dinitrophenyl)-1,4-benzenediamine (Disperse Yellow 9, hereafter referred to as DY-9), and the solution was heated to 110° C. for 4 hours. When the polymer was fully imidized, as indicated by infrared (IR) spectroscopy, the polymer product was precipitated by pouring the solution into excess hexane. The polymer product was filtered off, dried in vacuum and dissolved in cyclohexanone to achieve a concentration of about 2% by weight, based on the solvent weight. A film having a thickness of about 50 nm and having an optical absorbance coefficient of about 14/μm was prepared by applying the polymeric solution to a lithographic substrate and spinning to achieve a thin, uniform film.

EXAMPLE 2

The polymer product of Example 1 was dried in vacuum and dissolved in cyclohexanone to achieve a concentration of about 6% by weight, based on the solvent weight. A film having a thickness of about 200 nm and having an optical absorbance coefficient of about 14/μm was prepared by applying the polymeric solution to a lithographic substrate and spinning to achieve a uniform thin film.

EXAMPLE 3

A solution of 3.0 grams of maleic anhydride-vinylmethylether copolymer and 5.4 grams of DY-9 in 220 grams of cyclopentanone was heated at 130° C. until the imidization reaction was complete. The solution was filtered through 0.1 μm filters and applied directly, without isolation of the reaction product, to a lithographic substrate, followed by spinning to form a uniform thin film. The film of 60 nm had an optical absorbance coefficient of 14/μm at 365 nm and 22/μm at 248 nm. The film was essentially transparent at wavelengths longer than about 450 nm and the film thickness could be measured by the use of a NANOSPEC reflectance film thickness measuring instrument, using a refractive index of 1.701 at 6238 Å and the appropriate Cauchy coefficients.

EXAMPLE 4

A solution of 3.0 grams of maleic anhydride-vinylmethylether copolymer and 5.4 grams of DY-9 in 220 grams of cyclohexanone was heated to 130° C. to form the imide product. As in Example 3, the instant composition was used directly, without isolation of the reaction product, on a lithographic substrate, followed by spinning to form a uniform thin BARL film.

EXAMPLE 5

A solution of 2.0 grams of styrene-maleic anhydride copolymer and 5.0 grams of DY-9 in 200 grams of cyclohexanone was heated to reflux until imidization was essentially complete. The imidized product was filtered and was used directly, without isolation of the reaction product, on a lithographic substrate, followed by spinning to form a uniform thin BARL film. The film had an Optical absorbance coefficient of 14/μm at 365 nm.

EXAMPLE 6

A solution of 3.0 grams of maleic anhydride-vinylmethylether copolymer and 4.1 grams of 2-aminoanthracene in 250 grams of cyclohexanone was heated to form the imide product as previously described. The product was filtered and was used directly, without isolation of the reaction product, on a lithographic substrate. Spinning produced a uniform thin BARL film on the lithographic substrate having a thickness of about 60 nm with an optical absorbance coefficient of about 29/μm at a wavelength of 248 nm.

EXAMPLE 7

The BARL formulation of Example 4 was applied to a 200 mm reflective polysilicon wafer by spin coating at 3000 rpm. Subsequently, a 1.2 μm thick film of a diazoquinone-novolak resist was coated over the BARL material and baked at 95° C. for 1 minute. The resist was patternwise exposed on a 365 nm GCA stepper to form 0.7 μm latent images. The resist was developed in 0.26N TMAH and the images were transferred by $CF_4$ etching in one step through the BARL material and into the polysilicon. There was no detectable image distortion. No standing waves were detected by scanning electron microscopy (SEM).

EXAMPLE 8

For a comparison of the effectiveness of various antireflective layers in reducing interference effects, the swing ratios were measured at 365 nm by the method of Brunner. The BARL material of Example 3 was coated on a polysilicon wafer, which was then overcoated with a novolak based photoresist. The measured swing ratio of this structure was compared with similar structures consisting of photoresist over TiN over polysilicon, and photoresist alone over polysilicon. The results are shown:

| SWING RATIOS OF A NOVOLAK RESIST OVER POLYSILICON USING BARL, TiN, OR NO ANTIREFLECTIVE UNDERLAYER | | |
|---|---|---|
| Resist/BARL | Resist/TiN | Resist Only |
| 9% | 17% | 41% |

That the BARL layer was more effective then TiN in reducing interference effects is clearly shown.

EXAMPLE 9

Two sets of silicon wafers were used to show the improvement in line width control accorded by use of the disclosed BARL compositions. Reflective polysilicon wafers in a control set were coated with a diazoquinone-novolak resist having discrete film thicknesses ranging from 1.00–1.30 μm. The resist was exposed on a GCA stepper, post exposure baked, and developed in 0.26N TMAH. The linewidths were measured by SEM. A second set of wafers was first coated with BARL composition of Example 4, then coated with the same novolak resist having the same film thicknesses as the control wafers. The resist was exposed, developed, and the linewidths were measured by SEM. Table 1 summarizes the relief image linewidths obtained either with or without the underlaying BARL material.

TABLE 1

| COMPARISON of IMAGES WITH and WITHOUT BARL on SILICON. | | |
|---|---|---|
| Resist Thickness | Resist only Linewidth | Resist/BARL Linewidth |
| 1.125 μm | 0.72 μm | 0.73 μm |
| 1.150 μm | 0.79 μm | 0.75 μm |
| 1.168 μm | 0.87 μm | 0.76 μm |
| 1.178 μm | 0.97 μm | 0.77 μm |

TABLE 1-continued

COMPARISON of IMAGES WITH and WITHOUT BARL on SILICON.

| Resist Thickness | Resist only Linewidth | Resist/BARL Linewidth |
|---|---|---|
| 1.201 μm | 0.94 μm | 0.76 μm |
| 1.224 μm | 0.86 μm | 0.75 μm |
| 1.254 μm | 0.79 μm | 0.74 μm |
| Standard Deviations of Line Thicknesses | | |
| | 0.088586 | 0.013451 |

It can be seen that linewidth variations are greatly reduced by including a BARL composition of the present invention in the processing.

EXAMPLE 10

A polysilicon wafer having 0.5 μm wide lines with sloped side walls etched into the wafer surface was coated with diazoquinone-novolak resist. Relief images characterized by 0.7 μm long patterns running parallel and close to the step were produced by exposing at 365 nm and developing the resist. Reflective notching was observed in the patterns. The same pattern was produced in a photoresist layer using an undercoat of the BARL material. No reflective notching was observed in the 0.7 μm patterns.

EXAMPLE 11

A portion of a solution of 3.0 grams of maleic anhydride-vinylmethylether copolymer and 5.4 grams of DY-9 in 200 grams of cyclohexanone was filtered, spin coated on a silicon wafer, and baked on a hot plate at 185° C. for 1.5 minutes. The film was not removed by treatment with propylene glycol ether acetate, or alternatively by treatment with 0.26N TMAH photoresist developer solution. As cast, the film had a thickness of 61 nm and had an optical absorbance coefficient of 13/μm at 365 nm.

EXAMPLE 12

The reduction in swing amplitude (SA) of photoresist on reflective substrates was evaluated for the BARL formulations of Examples 3 and 6 using the model of Brunner, based on the measured refractive index (RI) and optical absorbance coefficient (A/μm) of the BARL at a wavelength (WL) of 248 nm and at 365 nm. The calculated SA was also determined for theoretical BARLs formulated from the following aminoaromatic chromophores:

BARL-11 Aminoazoaniline
BARL-12 Aminonaphthalene
BARL-13 Aminocoumarin

The swing amplitudes for resist layers either with and without the BARL underlayer are compared in Table 2.

TABLE 2

| BARL | WL | SA/NoBARL | SA/BARL calculated | SA/BARL experimental | RI | A/μm |
|---|---|---|---|---|---|---|
| 2 | 365 | 36% | 8% | 7% | 1.93 | 14 |
| 2 | 248 | 98% | 14% | 16% | 2.13 | 19 |
| 5 | 248 | 98% | 4% | 3% | 2.12 | 31 |
| 11 | 365 | 36% | 7% | | 1.89 | 15 |
| 12 | 248 | 98% | 11% | | 2.13 | 22 |
| 13 | 365 | 36% | 11% | | 1.89 | 11 |

Although the examples are described with respect to compositions useful at an exposing radiation wavelength of 365 nm, compositions suitable for use at other wavelengths such as 193 nm, 248 nm, or 436 nm, or with broadband radiation, may be prepared by selecting the appropriate aminoaromatic chromophores.

Upon a reading of the present disclosure, it will be apparent to the skilled artisan that other embodiments of the present invention beyond those embodiments specifically described herein may be made or practiced without departing from the spirit of the invention. Similarly, changes, combinations and modifications of the presently disclosed embodiments will also become apparent. The embodiments disclosed and the details thereof are intended to teach the practice of the invention and are intended to be illustrative and not limiting. Accordingly, such apparent but undisclosed embodiments, changes, combinations, and modifications are considered to be within the spirit and scope of the present invention as limited solely by the appended claims.

What is claimed is:

1. A method for producing an antireflective layer on a lithographic substrate comprising the steps of:
   dissolving, in an organic solvent, a composition comprising the imide reaction product of at least one aminoaromatic chromophore with a polymer comprising an anhydride unit; and
   applying the solution to a lithographic substrate and removing at least a portion of said organic solvent.

2. The method of claim 1 having the additional step of applying a photosensitive film forming material over said antireflective layer on a lithographic substrate.

3. The method of claim 1 wherein the amount of the chromophore in the composition is greater than the amount of the polymer in the composition.

4. The method of claim 1 wherein the amount of the chromophore in the composition is greater than about 55 weight percent.

5. The method of claim 1 wherein the amount of the chromophore in the composition is in a range of about 55 to about 75 weight percent.

6. The method of claim 1 wherein the polymer comprises a repeat unit of the form

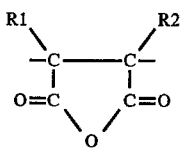

where R1 and R2 may be independently H, alkyl, phenyl or hydrogen.

7. The method of claim 1 wherein the polymer comprises repeat unit of the form

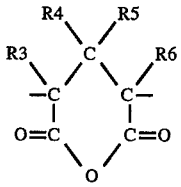

where R3, R4, R5, and R6 may be independently H, alkyl, phenyl or hydrogen.

8. The method of claim 1 wherein the aminoaromatic chromophore is a primary aryl amine.

9. The method of claim 1 wherein the aminoaromatic chromophore is selected from the group consisting of aminoanthracenes, aminonaphthalenes, benzylamines, N-(2,4-dinitrophenyl)-1,4-benzenediamine, p-(2,4-dinitrophenylazo)aniline, p-(4-N,N-dimethylaminophenylazo)aniline, 4-amino-2-(9-(6-hydroxy-3-xanthenonyl))-benzoic acid, 2,4-dintrophenylhydrazine, dinitroaniline, aminobenzothiazoline, and aminofluorenone.

10. The method of claim 1 wherein said polymer comprising an anhydride unit is a copolymer comprising a first repeat unit having an anhydride group and a second repeat unit having an ethylene group with at least one substituent.

11. The method of claim 10 wherein said first repeat unit is of the form

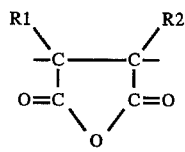

where R1 and R2 may be independently H, alkyl, phenyl or hydrogen.

12. The method of claim 10 wherein said first repeat unit is of the form

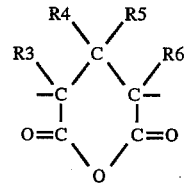

where R3, R4, R5, and R6 may be independently H, alkyl, phenyl or hydrogen.

* * * * *